United States Patent
Benson et al.

(10) Patent No.: US 7,556,697 B2
(45) Date of Patent: Jul. 7, 2009

(54) SYSTEM AND METHOD FOR CARRYING OUT LIQUID AND SUBSEQUENT DRYING TREATMENTS ON ONE OR MORE WAFERS

(75) Inventors: Arne C. Benson, Shakopee, MN (US); Erik D. Olson, Shakopee, MN (US); Douglas S. Spaeth, Chaska, MN (US)

(73) Assignee: FSI International, Inc., Chaska, MN (US)

( * ) Notice: Subject to any disclaimer, the term of this patent is extended or adjusted under 35 U.S.C. 154(b) by 983 days.

(21) Appl. No.: 10/866,916

(22) Filed: Jun. 14, 2004

(65) Prior Publication Data
US 2005/0276909 A1 Dec. 15, 2005
US 2007/0042110 A9 Feb. 22, 2007

(51) Int. Cl.
*B08B 7/00* (2006.01)
*B08B 5/04* (2006.01)
*C25F 3/30* (2006.01)

(52) U.S. Cl. .............. 134/21; 134/1; 134/1.3; 134/26; 134/32; 134/902

(58) Field of Classification Search ............ 134/1, 134/1.3, 21, 26, 32, 902
See application file for complete search history.

(56) References Cited

U.S. PATENT DOCUMENTS

| 5,169,408 | A | 12/1992 | Biggerstaff et al. | |
| 5,362,989 | A | * 11/1994 | Hennedy | 327/544 |
| 5,658,615 | A | 8/1997 | Hasebe et al. | |
| 5,756,155 | A | * 5/1998 | Tzeng et al. | 427/294 |
| 5,985,357 | A | 11/1999 | Sanada | |
| 6,551,403 | B1 | 4/2003 | Crabtree | |
| 6,612,319 | B1 | * 9/2003 | Rangarajan et al. | 134/104.1 |
| 2003/0226577 | A1 | * 12/2003 | Orll et al. | 134/1.3 |

FOREIGN PATENT DOCUMENTS

WO    WO 01/28950    4/2001

OTHER PUBLICATIONS

PCT International Search Report for PCT/US2005/018615.

* cited by examiner

*Primary Examiner*—Alexander Markoff
*Assistant Examiner*—Nicole Blan
(74) *Attorney, Agent, or Firm*—Kagan Binder, PLLC

(57) ABSTRACT

Systems for processing microelectronic substrates in a process chamber that incorporate improved technology for transitioning from a wet process to a dry process (especially transitioning from rinsing to drying). At least a portion of residual liquid remaining in fluid supply lines after a wet treatment is removed via a pathway that avoids purging directly onto the substrates. Related methods are also included in the present invention.

11 Claims, 5 Drawing Sheets

SYSTEM AND METHOD FOR CARRYING OUT LIQUID AND SUBSEQUENT DRYING TREATMENTS ON ONE OR MORE WAFERS

FIELD OF THE INVENTION

The present invention relates to technology for fabricating microelectronic devices using spray processor tools. More particularly, the present invention relates to processes including aspects in which a spray processor tool is used to contact one or more device precursors with a liquid (e.g., especially a rinsing liquid) and subsequently to dry the precursors.

BACKGROUND OF THE INVENTION

The microelectronic industry relies on a variety of wet/dry process recipes in the manufacture of a variety of microelectronic devices. The microelectronic industry can utilize a variety of configured systems to carry out such wet/dry processes. Many such systems are in the form of spray processor tools. A spray processor tool generally refers to a tool in which one or more treatment chemicals, rinsing liquids, and/or gases are sprayed onto one or more wafers either singly or in combination in a series of one or more steps. This is in contrast to wet bench tools where wafers are immersed in a fluid bath during the course of processing. In a typical spray processor tool, fluid is sprayed onto the wafer(s) while the wafer(s) are supported upon a rotating platen such as a turntable, chuck, or the like. Examples of spray processor systems include the MERCURY® or ZETA® spray processor systems available from FSI International, Inc., Chaska, Minn.; the SCEPTER™ or SPECTRUMS® spray processor systems available from Semitool, Inc., Kalispell, Mont.; a spray processor system available from SEZ AG, Villach, Austria and sold under the trade designation SEZ 323; and the like.

Typical recipes for spray processor tools may include process steps involving subjecting wafer(s) first to one or more wet processes (e.g., chemical treatments and/or rinsing treatments) after which the wafer(s) then are dried. For example, a conventional rinse/dry sequence may involve first spraying a rinsing liquid onto stacks of wafer(s) supported upon a rotating turntable in a process chamber. Rinsing is stopped and the plumbing used to deliver the rinse liquid is then purged into the process chamber. A drying gas may then be introduced into the chamber through the same or different plumbing to dry the wafer(s).

One way by which the effectiveness of a particular process recipe can be assessed is by measuring the degree to which particles are added to wafer(s) following a treatment in accordance with the process recipe. It is generally desirable that the number of added particles (i.e., added particles=measured particles after process recipe—measured particles before process recipe) is consistently as low as possible.

Some process recipes may perform well with respect to added particles only within a relatively narrow range of process parameters. For example, a conventional rinse/dry recipe may be practiced so as to yield consistently low added particles only when the rinse liquid is within a particular temperature range (e.g., moderately warm). Yet, this same recipe might suffer from unduly high and/or inconsistent added particles if the rinse liquid is at a temperature outside such range (e.g., if the rinse liquid is chilled or hot). This temperature restriction can limit the practical utility of such a recipe. For instance, it might otherwise be desirable to be able to use very hot rinse liquid to reduce cycle time, inasmuch as the hotter liquid might rinse wafer(s) faster and dry faster. Further, it might otherwise be desirable to be able to use very cold rinse liquid to treat temperature sensitive substrates. In short, conventional rinse/dry sequences may tend to be unduly temperature sensitive with respect to added particles, often at the expense of process flexibility.

As microelectronic device features become smaller and smaller, the size restrictions upon added particles become more stringent. For example, for larger-sized features, monitoring added particles that are greater than 150 nm in size (Such a specification is often referred to as "particles >150 nm" or another similar reference.) might be sufficient to help ensure acceptable device quality. However, for smaller features, monitoring particles >90 nm, or >65 nm, or even smaller added particles may be desirable. Some conventional rinse/dry sequences may perform well with less stringent monitoring, but may not perform as well as might be desired when monitoring smaller added particles.

There is a continuing need, therefore, in the microelectronics industry to carry out wet/dry process recipes with consistently lower added particles. In particular, there is a continuing need in this area to provide approaches that are more temperature insensitive and/or that provide lower added particles even when more stringent monitoring standards, e.g., standards such as >90 nm, >65 nm, or the like, are applied.

SUMMARY OF THE INVENTION

The present invention provides improved technology for carrying out a sequence of one or more wet liquid treatments (especially rinsing) and subsequent drying treatments when processing one or more wafers. More specifically, the present invention provides an improved way to transition from a wet treatment to a drying treatment in a manner that dramatically reduces added particles that might otherwise be observed following a more conventional wet/dry sequence. The present invention appreciates that the character of this transition can significantly impact added particle performance.

The present invention is especially useful in carrying out a rinse/dry recipe in a spray processor tool. The invention is most beneficially practiced at least to carry out a transition between a final rinsing treatment and a subsequent drying treatment practiced in a spray processor tool, after which the wafer(s) would be removed from the tool. Indeed, we have obtained very neutral added particle data for particles having a size greater than 65 nanometers (nm) on 300 millimeter (mm) wafers when using a stand-alone rinse/dry treatment in a spray processor tool of the present invention. See FIGS. 2a, 2b, 3a, and 3b, discussed further below, for data demonstrating this.

Dramatically improved performance with respect to added particles is not the only observed benefit. We have also observed the significant benefit that process performance in terms of added particles is relatively insensitive to the temperature of the rinse liquid. That is, improved performance with respect to added particles can be obtained regardless of whether the rinse liquid temperature is cold, ambient, warm, or hot. The ability to practice rinsing practically at any desired temperature in which the rinsing medium exists as a liquid without an undue increase in added particles offers tremendous flexibility with respect to the kinds of rinsing and drying recipes that can be used as well as the kinds of wafers that can be processed. This advantage is in stark contrast to a more conventional methodology that tends to provide optimum performance only for rinse liquid within a relatively narrow range of temperatures.

Faster cycle times may be achieved by being able to rinse with hot rinse liquid (e.g., 60 C to 100 C) in some embodiments without undue risk that the use of hot liquid will cause too great an increase in added particles. Quite simply, hotter rinse liquid tends to evaporate faster and wafers rinsed with hotter liquid can be dried more rapidly than wafers rinsed with cooler liquid. Moreover, hotter rinse liquid can be used to heat the process chamber, which can reduce the time needed to dry the wafers and the chamber. For example, a particular recipe involving the use of warm water (35 C) required 400 seconds (6.7 minutes) of drying time. Using hot rinsing water (85 C), this drying time can be dramatically reduced by 4.5 minutes while still providing very neutral added particles.

The present invention is based, at least in part, upon a practical, technical solution for the problem that added particles may result as a consequence of the manner by which a process recipe transitions from a wet treatment, e.g., rinsing, to a drying treatment. A conventional process, for example, may involve a recipe in which wafers are rinsed, then the rinse lines are purged into the process chamber, and then the wafers are dried. While not wishing to be bound by theory, we believe that such unguarded, bare purging is a significant cause of added particles. We have observed that a mist or aerosol of the liquid is generated when liquid lines are purged into the process chamber. Except perhaps over a relatively narrow temperature range, this mist or aerosol may settle as fine droplets onto the surfaces of the drying wafers. These droplets may then be detected as light point defects, and hence as added particles. The number of added particles tends to be greatest with respect to smaller particles, e.g., particles less than about 90 nm in size. In short, unguarded, bare purging of liquid according to conventional methodologies is believed to be a source of added particles in which the number of added particles is a strong function of the temperature of the purged liquid. In one mode of practice, the present invention incorporates suckback functionality, preferably via aspirating, into at least a portion of the plumbing through which a treatment liquid, especially a rinsing liquid, is dispensed into a process chamber. This allows at least a portion of residual liquid remaining in the corresponding supply line(s) to be removed via suckback rather than being removed solely via purging into the chamber after the primary flow or spray of the liquid into the chamber is stopped. By sucking back at least a portion of residual rinse liquid, a lesser amount of aerosol or mist is generated that would be able to impact the wafer surfaces.

Also, while not wishing to be bound by theory, we believe that as soon as the wafer surfaces start to dry, the surfaces become vulnerable to spotting. Further, faster drying tends to increase this vulnerability. Thus, purging tends to be more problematic in terms of added particles when wafer surfaces are dry or partially dry as purging occurs. Such a problem can especially be present when, for example, a wafer(s) is being spun in a process chamber during purging. Spinning wafer(s) tend to dry or begin to dry in a time period shorter than the time period for purging to be completed. In other words, purging takes more time than drying. As purging continues, there comes a time when mist/aerosol associated with purging therefore contacts relatively dry wafer surfaces. Consequently, the longer purge cycle makes spinning wafer surfaces more vulnerable to spotting.

The present invention also includes embodiments in which one or more liquid supply lines are purged into the process chamber while one or more other supply lines are used to wet the wafer surfaces. After the former lines are purged, flow through the latter lines can be stopped after which such latter lines are emptied via sucking back the residual liquid. The present invention is significant in that it allows at least some purging, if desired, to occur into the process chamber while the wafer surface(s) are still wet and protected from the aerosol or mist that tends to accompany purging.

Alternatively, purging into the chamber can be avoided completely in the transition from a wet treatment to a drying treatment if the sucking back functionality is used to remove all of the residual liquid through the supply lines.

Thus, the embodiments discussed above contemplate that, at least at the end of a rinsing treatment, at least a portion of the residual liquid in liquid supply line(s) is not purged directly into the process chamber, but rather is removed from the equipment via a different pathway. Sucking back is just one way of supplying the removal energy by which such residual liquid may be withdrawn. Other removal strategies with appropriate valving, additional plumbing, and/or the like, for instance, may involve using pressure to blow residual liquid from the lines to a destination, e.g., a drain or recycle, other than directly into the process chamber.

Thus, it can be appreciated that any conventional system now or hereafter known that purges residual liquid, especially rinse liquid, into a process chamber could benefit from using sucking back functionality in accordance with the present invention.

In another mode of practice, the present invention provides a process recipe in which at least a portion of a remaining treatment liquid, especially a rinsing liquid, is not purged into the process chamber. Instead, the remaining portion of the treatment liquid is simply left standing in the corresponding supply line(s) until after the one or more wafers are removed from the process chamber. After the wafer(s) are removed from the process chamber, the remaining treatment liquid can be sucked back or safely purged into the process chamber.

The present invention also includes embodiments in which one or more liquid supply lines are purged into the process chamber while one or more other supply lines are used to wet the wafer surfaces. After the former lines are purged, flow through the latter lines can be stopped, after which the wafer (s) are removed followed by purging or sucking back of such latter lines. This aspect of the present invention is significant in that it allows at least some purging, if desired, to occur into the process chamber while the wafer surface(s) are still wet and protected from the aerosol or mist that tends to accompany purging.

Alternatively, purging into the chamber can be avoided completely in the transition from a wet treatment to a drying treatment if all of the residual liquid in the supply lines is simply left standing.

In one aspect, a system for processing microelectronic substrates according to the present invention includes a process chamber in which one or more microelectronic substrates may be positioned during a process, a fluid delivery pathway through which a fluid can be dispensed onto the substrates positioned in the process chamber, and a fluid removal pathway fluidly coupled to the fluid delivery pathway in a manner such that at least a portion of a residual liquid in the fluid delivery pathway can be withdrawn from the fluid delivery pathway without purging at least the residual liquid portion directly onto the one or more substrates.

In another aspect, a spray processor system according to the present invention includes a process chamber in which one or more microelectronic substrates may be positioned during a process and a fluid delivery system in fluid communication with the process chamber. The fluid delivery system includes a fluid delivery pathway through which a fluid can be dispensed onto the substrates positioned in the process chamber, a fluid removal pathway fluidly coupled to the fluid delivery pathway in a manner such that at least a portion of a residual liquid in the fluid delivery pathway can be withdrawn from at least a portion of the fluid delivery pathway without purging at least the portion of the residual liquid directly onto the one or more substrates, and a fluid by-pass pathway fluidly coupled to the fluid delivery pathway and the fluid by-pass pathway in a manner such that, when a gas flows through the fluid by-pass pathway, a vacuum is applied to at least a portion of the fluid delivery pathway and the fluid removal pathway.

In another aspect, a method of processing one or more microelectronic substrates according to the present invention includes the steps of positioning one or more microelectronic substrates in a process chamber, dispensing a liquid into the process chamber and onto the one or more substrates through a fluid delivery pathway, stopping dispensing of the liquid, wherein an amount of residual liquid remains in the fluid delivery pathway, causing at least a portion of the residual liquid to be removed from the fluid pathway through a fluid removal pathway such that said portion of the residual liquid is not purged directly onto the substrates, and drying the substrates.

In another aspect, a method of processing one or more microelectronic substrates according to the present invention includes the steps of positioning one or more microelectronic substrates in a process chamber, dispensing a first liquid flow into the process chamber and onto the one or more substrates via a first fluid delivery pathway, dispensing a second liquid flow into the process chamber and onto the one or more substrates via a second fluid delivery pathway, stopping dispensing of the first liquid flow such that an amount of residual liquid remains in the first fluid delivery pathway, purging the first fluid delivery pathway into the process chamber while the dispensing of the second liquid flow is occurring, stopping the dispensing of the second liquid flow after stopping purging of the first fluid delivery pathway such that a residual amount of liquid remains in the second fluid delivery pathway, and removing at least a portion of the residual amount of liquid in the second fluid delivery pathway through a fluid removal pathway such that said portion of the residual amount of liquid in the second fluid delivery pathway is not purged onto the substrates.

In another aspect, a spray processor system according to the present invention includes a process chamber in which one or more microelectronic substrates may be positioned during a process, a fluid delivery pathway through which a fluid can be dispensed onto the substrates positioned in the process chamber, a fluid by-pass through which a fluid can be diverted from the fluid delivery pathway, a first valve coupling the fluid delivery pathway and the fluid by-pass, a fluid removal pathway located relatively downstream from the fluid by-pass when the first valve is in a normal state, and a second valve coupling the fluid removal pathway to the fluid delivery pathway. The first valve in a normal state is open to allow a fluid to continue to flow through the fluid delivery pathway and is closed to block flow of a fluid into the fluid by-pass from the fluid delivery pathway, and wherein the first valve in an actuated state is closed to block flow of a fluid downstream through the fluid delivery pathway and is open to allow flow of a fluid from the fluid delivery pathway to the fluid by-pass. The second valve in a normal state is open to allow a fluid to continue to flow through the fluid delivery pathway and is closed to block a flow of a fluid into the fluid removal pathway from the fluid delivery pathway, and wherein the second valve in an actuated state is open to allow fluid communication between the fluid removal pathway and at least a portion of the fluid delivery pathway between the second valve and the process chamber.

BRIEF DESCRIPTION OF THE DRAWINGS

The understanding of the above mentioned and other advantages of the present invention, and the manner of attaining them, and the invention itself can be facilitated by reference to the following description of the exemplary embodiments of the invention taken in conjunction with the accompanying drawings, wherein.

DETAILED DESCRIPTION

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

Figure 1:
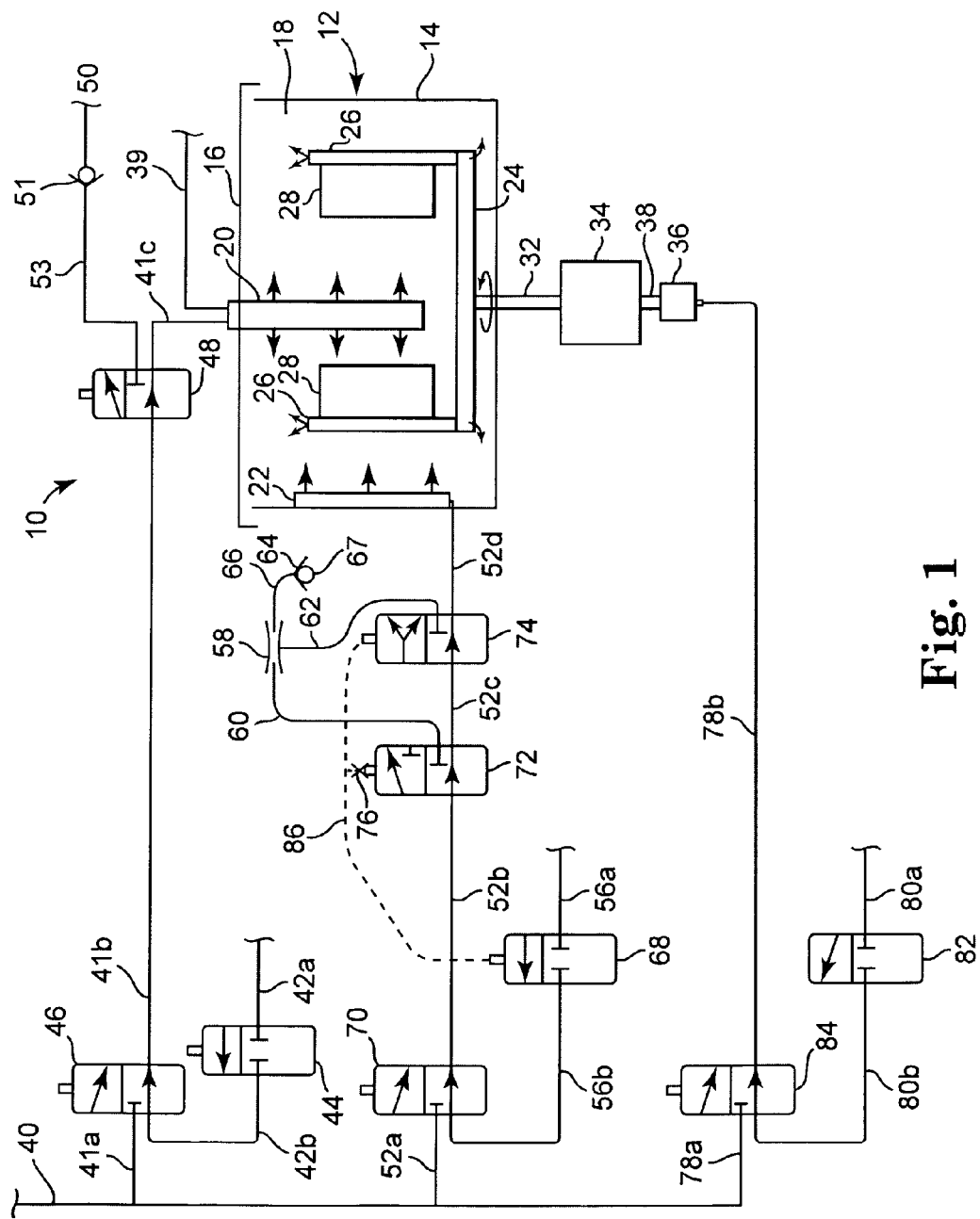
FIG. 1 illustrates a schematic diagram of a spray processor tool according to the present invention.

FIG. 1 shows a representative manner by which principles of the present invention may be incorporated into the rinse and drying componentry of a wafer processing system 10 such as the MERCURY® or ZETA® spray processor systems available from FSI International, Inc., Chaska, Minn. These systems advantageously are available to process both 200 mm and 300 mm wafers. Specifically, the rinse and drying componentry is modified so as to incorporate aspirating functionality to allow suck back of liquids, preferably during the course of a transition from a rinsing treatment to a drying treatment as described below. Except for such modification of the rinse and drying componentry as described herein, system 10 in this illustrative mode of practice otherwise may be identical to the commercially available MERCURY® or ZETA® spray processor systems, and other conventional componentry of such systems is not shown for purposes of clarity.

System 10 includes spray processor tool 12 that generally includes housing 14 and lid 16 enclosing chamber 18. Liquids and/or gases may be introduced into chamber 18 through center spray post 20, which descends from lid 16. The introduction of material through center spray post 20 is schematically indicated by arrows directed away from center spray post 20 and into chamber 18. Rotatable turntable 24 is coupled to motor 34 by shaft 32 such that rotatable turntable 24 can rotate about the axis of shaft 32 as indicated by the arrow around shaft 32. Posts 26 extend from turntable 24 so as to support one or more carriers 28 in which one or more wafers (not shown) are held during the course of treatment(s). Rotatable turntable 24 and one or more post(s) 26 can provide another pathway by which liquids and/or gases may be introduced into chamber 18 as indicated by the arrows directed away from turntable 24 and away from the top of support posts 26 and into chamber 18. Rotary union 36 is fluidly coupled to motor 34 by coupling 38 and helps to deliver liquids and/or gases from a supply source to the rotating environment inside chamber 18. A particularly preferred embodiment of a rotary union 36 is described in Assignee's co-pending application titled "Rotary Unions, Fluid Delivery Systems, and Related Methods," in the names of Benson et al., bearing Attorney Docket No. FSI0135/US, and filed Mar. 12, 2004, the entirety of which is incorporated herein by reference. One or more sidebowl spray post(s) 22 are positioned in chamber 18 and provide another pathway by which liquids and/or gases may be introduced into chamber 18 as indicated by the arrows directed away from sidebowl spray post(s) and into chamber 18.

In the particular embodiment shown, rinsing liquid(s) and drying gas(es) may be introduced into chamber 18 through any of center spray post 20, turntable 24/supports 26, and/or sidebowl spray post(s) 22. Other kinds of process liquid or gaseous process chemicals can be conveniently introduced into chamber 18 through center spray post 20 via one or more line(s) depicted schematically as other chemical line 39.

A preferred embodiment of rinsing and drying componentry incorporating aspirating functionality will now be described in more detail. A rinse liquid such as deionized water is supplied to system 10 via supply line 40 from one or more water sources (not shown). The water preferably is filtered and purified in accordance with good practice in the microelectronics industry. Filtering and purification componentry (not shown) may be incorporated into system 10 and/or may be external to system 10.

From supply line 40, the rinse liquid is conveyed to center spray post 20 via lines 41a, 41b and 41c. One or more gases, such as nitrogen, are supplied to center spray post 20 from a supply source (not shown) via lines 42a and 42b and then via lines 41b and 41c. The flow of liquid and gas to center spray post 20 through lines 41a, 41b, 41c, 42a, and 42b is controlled by valves 44, 46, and 48. Valve 44 as shown is normally closed with respect to gas flow and is actuated to allow gas to flow from line 42a to 42b. Valve 46 is normally open to allow gas to flow from line 42b to 41b, but is normally closed with respect to the flow of liquid from line 41a to 41b. When valve 46 is actuated, liquid may flow through the valve, while the flow of gas is blocked. Valve 48 controls the flow of liquid or gas from line 41b to center spray post 20 via line 41c, or otherwise may divert the flow of liquid and/or gas, as the case may be, to drain 50 via line 53. Valve 48 is normally open so as to allow flow of fluid from line 41b to 41c. When actuated, valve 48 diverts the flow of fluid through check valve 51, via line 53. Check valve 51 can be connected to one or more other components designed to receive such fluids. As shown, check valve 51 is connected to drain 50, and prevents the flow of liquid (or gas) from flowing back from drain 50 and into valve 48.

From supply line 40, the rinse liquid is conveyed to side bowl spray post 22 via lines 52a, 52b, 52c, and 52d. One or more gases, such as nitrogen, are supplied to side bowl spray post 22 from a supply source (not shown) via lines 56a and 56b and then via lines 52b, 52c, and 52d. The gas supply source may be the same or different from the supply source that supplies gas to the center spray post 20. The flow of gas and/or liquid through lines 52b, 52c, and 52d may be diverted to aspirator 58 via lines 60 or 62, respectively. From aspirator 58, fluids may flow thru check valve 64, via line 66. Check valve 64 can be connected to one or more other components designed to receive such fluids. As shown, check valve 64 is connected to drain 67, and prevents the flow of liquid (or gas) from flowing back from drain 67 and into aspirator 58. Drain 67 may be the same or different from drain 50.

Spray processor systems according to the present invention advantageously incorporate a treatment liquid removal functionality with respect to at least one fluid supply line so as to be able to remove at least a portion of a treatment liquid from the fluid supply without having to purge all of the liquid into a process chamber of the spray processor tool. Aspirator 58 is a common type of device that makes use of the Bernoulli principle to help provide such removal functionality. When a fluid, such as a gas in the case of system 10, is forced through a smooth constriction in the device, the fluid velocity increases. This lowers the pressure. In other words, a vacuum is established which, with valves 72 and 74 appropriately set, may be used to aspirate or suck back liquid from side bowl spray post 22 for transport to another location, such as, for example, for disposal through drain 67. A representative mode of practice to accomplish this in the context of a rinsing and drying sequence of treatments will be described further below.

Many suitable embodiments of aspirators are commercially available from a number of commercial sources. One illustrative embodiment of an aspirator found to be suitable in the practice of the invention is commercially available under the trade designation GALTEK® from Entegris, Inc., Chaska, Minn.

The flow of fluid(s) to side bowl post 22 is controlled by valves 68, 70, 72, and 74. Valve 68 as shown is normally closed with respect to gas flow and is actuated to allow gas to flow from line 56a to valve 70 via line 56b. Valve 70 is normally open to allow gas to flow from line 56b to line 52b, but is normally closed with respect to the flow of liquid from line 52a to 52b. When valve 70 is actuated, liquid may flow through valve 70, while the flow of gas is blocked. Valve 72 may be used to divert fluid, gas and/or liquid, from line 52b to aspirator 58, via line 60. In its normal state, valve 72 is set so that fluid flows from line 52b to 52c. When valve 72 is actuated, fluid is diverted from line 52b to line 60. Valve 72 includes a snubber 76 that sufficiently delays the return of valve 72 to its normal condition such that any excess gas pressure present in lines 56b and/or 52b is released to drain 67 via aspirator 58 and lines 60 and 66 and not into chamber 18 (discussed below). Valve 74 may be used to divert/pull fluid from line 52c and 52d to aspirator 58, via line 62, depending upon how it is set. In its normal state, valve 74 is set so that fluid flows from line 52c to side bowl post 22, via line 52d. When actuated, lines 52c and 52d and side bowl spray post 22 are in fluid communication with line 62 and aspirator 58. Thus, for instance, when valves 68, 72, and 74 are simultaneously actuated together as schematically depicted by dotted line 86, gas flowing through lines 56a, 56b, 52b and 60 to aspirator 58 via valve 72 creates a vacuum or suction effect in lines 52c, 52d, and 62, and in side bowl spray post 22. As a consequence, liquid in lines 52c, 52d, and 62, and in side bowl spray post 22 is sucked back through aspirator 58 in the presence of this vacuum effect. After sucking back liquid in lines 52c, 52d, and 62, and side bowl spray post 22, valves 68, 72, and 74 can simultaneously return to their normal state (as schematically depicted by dotted line 86), subject to a delay provided by snubber 76. Snubber 76 on valve 72 is set to provide a time delay that sufficiently delays the return of valve 72 to its normal state such that any excess gas pressure present in lines 56b and/or 52b is released to drain 67 via aspirator 58 and lines 60 and 66 and not into chamber 18 via lines 52c and 52d and side bowl spray post 22. If any excess gas pressure in lines 56b and/or 52b is directed through lines 52c and 52d and side bowl spray post 22 when valves 72 and 74 are returned to their normal state, residual liquid that may be present in lines 52c and/or 52d and/or side bowl spray post 22 may be caused to form a short burst of mist/aerosol from the excess pressure and be discharged into chamber 18. This is undesirable because such mist/aerosol can contact the dry wafers in chamber 18 and add particles to the wafers, especially since drier wafers are more sensitive to mist/aerosols. Dotted line 86 schematically depicts that valves 68, 72, and 74 are actuated together, subject to the snubber 76 delaying the return of valve 72 when the valves 68, 72, and 74 are returned to their normal states.

As mentioned, rotatable turntable 24 and one or more post(s) 26 can provide another pathway by which liquids and/or gases may be introduced into chamber 18. For example, as shown, from supply line 40, the rinse liquid is conveyed to turntable 24 and support posts 26 via lines 78a and 78b, and one or more gases, such as nitrogen, are supplied to turntable 24 and support posts 26 from a supply source (not shown) via lines 80a and 80b, and then via line 78b. The gas supply source may be the same or different from the supply source that supplies gas to the center spray post 20 and/or side bowl spray post 22. The flow of liquid and gas to turntable 24 and support posts 26 through lines 78a, 78b, 80a and 80b is controlled by valves 82 and 84. Valve 82 as shown is normally closed with respect to gas flow and is actuated to allow gas to flow from line 80a to 80b. Valve 84 is normally open to allow gas to flow from line 80b to line 78b, but is normally closed with respect to the flow of liquid from line 78a to 78b. When valve 84 is actuated, liquid may flow through valve 84, while the flow of gas is blocked.

Valves 44, 46, 48, 68, 70, 72, 74, 82, and 84 may be of any type or combinations of any types such as pneumatic, electronic, and the like. Pneumatically controlled embodiments are preferred because they are inherently more reliable when used in a harsh environment containing chemicals, chemical fumes, and frequent washdowns. These are available from a wide range of commercial sources such as Entegris, Inc., Chaska, Minn.; and Saint Gobain, San Jose, Calif.

Rinse liquid(s) may be supplied to any one or more of center spray post 20, side bowl spray post 22, or turntable 24/support posts 26 at any suitable supply rate(s) and temperature(s) as might be reasonably desired, such as in accordance with conventional practices, or as described herein, and/or as described in applicants co-pending application that is referenced above. Flow rates and temperatures will depend upon a variety of factors including the nature of the recipe being carried out, the nature of the wafer(s) being treated, the type of equipment being used, and the like. In the context of the MERCURY or ZETA spray processor systems commercially available from FSI International, Inc., typical flow rates of rinse liquid(s) preferably are in the range of 2 liters/minute to 12 liters/minute at any desired temperature at which freezing or boiling of the rinse liquid(s) generally is avoided. If the liquid(s) are to be heated and/or chilled, suitable equipment (not shown) for heating or chilling the liquid(s) may be incorporated into system 10 and/or be external to system 10.

The system 10 allows suck back functionality to be applied to the side bowl spray post 22 during the course of one or more treatments. Such functionality advantageously and preferably is applied during at least a portion of a rinse treatment, especially during the terminal portion of a rinse treatment as a transition is made from rinsing to drying. It has been found that applying suck back functionality during at least a portion of such a transition advantageously provides very consistent and very neutral added particle results.

The degree to which particles are added to a wafer following a treatment is one way in which the effectiveness of a particular process recipe can be assessed.

It is generally desirable that the number of added particles is consistently as low as possible. Using conventional methodologies, such results can be difficult to achieve except for using rinse liquid at a temperature within a relatively narrow range. This is especially the case with respect to very small added particles, e.g., particles whose size is about 90 nm or less. Practice of the present invention greatly improves performance with respect to added particles. This is explained further in the examples below and is graphically depicted in FIGS. 2a, 2b, 3a, and 3b, discussed below.

As illustrated in FIG. 1 with respect to system 10, an aspirator device is incorporated only in the plumbing leading to side bowl spray post 22 so as to provide a suck back capability with respect to side bowl spray post 22. In alternative embodiments, similar suck back capability may be provided with respect to the plumbing leading to center post 20 and/or turntable 24/support posts 26 in addition to or in lieu of that provided with respect to side bowl spray post 22.

Representative modes of practicing the present invention using system 10 of FIG. 1 in which suck back functionality is practiced during a transition from rinsing to drying will now be described. In a first phase, a typical rinsing and drying sequence may involve setting valves 44, 46, 48, 68, 70, 72, 74, 82, and 84 to dispense rinse liquid onto wafers through center post 20, sidebowl spray post 22, and optionally turntable 24/supports 26. Specifically, valves 46, 70, and 84 are actuated, and the other valves are in their normal state. An aqueous rinse liquid may be at a temperature in the range of 0 C to about 100 C. Other kinds of rinse liquids generally would be at a temperature above the freezing point but below the boiling point. A typical flow rate of rinsing liquid through center spray post 20 is in the range of 5 to 8 liters per minute (1 pm). A typical flow rate of rinsing liquid through sidebowl spray post 22 is in the range of 8 to 13 1 pm. A typical flow rate of rinsing liquid through turntable 24 and supports 26 is in the range of 8 to 13 1 pm (rinsing liquid, and the flowrate thereof, is supplied to turntable 24 and supports 26 together). Turntable 24 may rotate at one or more speeds during such rinsing in the range of 5 rpm to 500 rpm. Rinsing in this fashion may continue for any desired time interval such as 30 seconds to 10 minutes.

In the next phase, the center spray post 20, the turntable 24, and the supports 26 are purged while the wafers continue to be wetted through side bowl spray post 22. Valve 44 is actuated and valves 46 and 48 are in their normal state so that pressurized purging gas purges residual liquid from lines 41b and 41c and central spray post 20 into process chamber 18. Valve 82 is actuated and valve 84 is in its normal state so that pressurized purging gas purges residual liquid from lines 78b, turntable 24, and supports 26 into process chamber 18. Because the wafers are well wetted by the flow of rinsing liquid through side bowl spray post 22, the risk that purging might cause undue water spots on the wafer surfaces is greatly minimized.

A variety of purging gases may be used. Representative examples include nitrogen, carbon dioxide, combinations of these, and the like. The purging gas typically may be supplied at a pressure of 10 to 40 psi, a temperature of 20 to 30° C, at a flow rate of 2 to 10 scfm.

In the next phase, purging through center spray post 20, turntable 24, and supports 26 is stopped while rinsing liquid continues to flow through sidebowl spray post 22. This may be accomplished by causing valves 44, 46, and 48 to be in their normal states so that no gas or liquid flow to center spray post 20 and by causing valves 82 and 84 to be in their normal states so that no gas or liquid flows through turntable 24 and supports 26. This phase preferably continues for a short time interval, e.g., from 1 to 20 seconds, so that there is a little delay between this phase and the next phase. Longer time intervals may be used, if desired (e.g., if the buffer time is used to accomplish other process tasks) but a longer delay can unnecessarily lengthen cycle time.

In the next phase, the flow of rinsing liquid through side bowl spray post 22 is stopped and aspiration occurs to suck back and direct residual rinsing liquid to drain 67. To accomplish this, valves 68, 72 and 74 are actuated while valve 70 is in its normal state. Consequently, liquid flow through side bowl spray post 22 is stopped. Preferably, this flow is stopped as rapidly as practical as water spotting, and hence added particles, tends to increase with increased stopping time. Additionally, purging gas flows through line 56a, line 56b, line 52b, line 60, aspirator 58, line 66, check valve 64, and into drain 67. This creates a vacuum in side bowl spray post 22, line 52c, line 52d, and line 62, helping to remove residual liquid to drain 67.

A drying phase now occurs. Any suitable method of drying one or more wafers in a spray processor can be used at this point, such as by, for example, spin drying the wafer(s) in the chamber 18 and, optionally, while discharging a drying gas into chamber 18 (e.g., applying a drying gas directly to the surfaces of a wafer(s)). For example, a drying phase may involve setting valves 44, 46, 48, 68, 70, 72, 74, 82, and 84 to dispense drying gas onto wafers through one or more of center post 20, sidebowl spray post 22, and turntable 24/supports 26. Specifically, valves 46, 48, 70, 72, 74, and 84 are in their normal state (i.e., unactuated), and valves 44, 68, and 82 are in their normal state (note: in this drying phase, valves 72 and 74 are not actuated with valve 68 as they are in the purging phase described above). A variety of drying gases may be used. Representative examples include air, nitrogen, carbon dioxide, argon, isopropyl alcohol, combinations of these, and the like. The drying gas may be supplied at a pressure of from 10 to 40 psi, a temperature of from 20 to 30° C, at a flow rate of from 2 to 10 scfm.

Also, as mentioned, spin-drying can be used, alone or in combination, with the application of a drying gas. For example, spin-drying may involve rotating turntable 24 at one or more speeds in the range of 5 rpm to 500 rpm, while dispensing drying gas onto the wafer(s) through one or more of center post 20, sidebowl spray post 22, and turntable 24/supports 26. Drying in this fashion may continue for any desired time interval such for about 5 minutes.

The present invention will now be further described with respect to the following illustrative examples.

METHODOLOGY FOR COMPARATIVE EXAMPLE A AND EXAMPLES 1-3

New, 300-mm, bare silicon test wafers are used in Comparative Example A and Examples 1-3. The wafers are first removed from their shipping container and loaded into a FOUP, which is used to transport test wafers within the cleanroom. The FOUP includes a total of 25 wafer slots. The test wafers are loaded into slots 1, 13 and 25 with the remaining 22 slots being filled with dummy wafers. Once moved into the FOUP, the test wafers, but not the dummy wafers, are analyzed by measuring the defects on the wafers using a nonpatterned wafer inspection tool having model number SP1-TBI and commercially obtained from KLA Tencor, San Jose, Calif. After programming the wafer inspection tool to inspect the three test wafers in slots 1, 13, and 25, the FOUP is moved into the wafer inspection tool where each test wafer (in slots 1, 13, and 25) is removed from its respective slot and analyzed, one at a time. After a test wafer is removed from the FOUP, it is moved into a scanning chamber in the inspection tool where a laser scans the wafer for defects. This metrology system reports the location and size of all defects on a wafer surface. This report is termed the "pre-count" of defects prior to processing for each of the test wafers. After scanning, the FOUP including the wafers is loaded into a ZETA® spray processor for processing. The ZETA® spray processor transfers 25 wafers from a FOUP into a wafer process cassette that has 27 wafer slots. The two additional wafer slots provide slots for cover wafers at the top and bottom of the cassette. The reason for this is to ensure that each test wafer has at least one wafer above and at least one wafer below it while being processed. Due to the robotics inside the material handling system, the order of the wafers is inverted when moved from the FOUP into the process cassette. Therefore, the wafer that came from slot 1 in the FOUP will be placed in slot 26 in the process cassette, wafer 13 will go to slot 14 and wafer 25 will go to slot 2. The spray processor also requires that the turntable be balanced to reduce potential vibration while spinning the wafers. This balancing is achieved by placing another cassette opposite the first cassette on the rotating turntable. Because only 25 wafers come from the FOUP, the remaining two slots are loaded with dummy wafers that are stored in the material handling system. Once the two cassettes are loaded into the process chamber, there are a total of 54 wafers split between two process cassettes including three test wafers in one cassette. Now, the wafers are ready to be subjected to a process recipe in the ZETA® spray processor commercially available from FSI International, Inc., Chaska, Minn.

The process recipe used to treat wafers in Comparative Example A and Examples 1-3 is referred to as a post-ash clean process which has two chemical steps separated by a rinsing step. The second chemical step is followed by a final rinse/dry step. The first chemical step involves a treatment liquid that is a mixture of sulfuric acid and hydrogen peroxide. This treatment liquid is commonly referred to as a "piranha" treatment. The ratio of these chemicals is 4 parts sulfuric acid and 1 part hydrogen peroxide. When mixed, these two chemicals create an exothermic reaction heating the solution to approximately 80 C. This solution is dispensed onto the wafers in the process chamber, which are spinning at 60 rpm. This mixture is dispensed at a flowrate of approximately one (1) 1 pm for 240 seconds. Following the "piranha" treatment, the wafers, chamber and plumbing are rinsed and purged with various combinations of hot DI water at about 95 C, cold DI water at about 17-23 C and nitrogen gas. The purpose of this rinse is to completely remove all traces of the "piranha" chemistry from the system prior to dispensing the next chemicals. The last chemical step involves a treatment liquid that is a mixture of ammonium hydroxide, hydrogen peroxide and DI water. This chemical step is commonly referred to as an "SC1" clean. The SC1 mixture is dispensed at a total flow rate of about 2 liters per minute and at a temperature of about 55 C. The mixture is dispensed onto the wafers in the process chamber, which are spun at speeds ranging from 20 to 300 rpm. The total chemical exposure time in the SC1 step is approximately 235 seconds. The chemical dilution for the SC1 mixture is typically 1 part ammonium hydroxide, two parts hydrogen peroxide and 42 parts DI water. Upon completion of the SC1 chemical step, the wafers are subjected to a final rinse/dry step. Comparative Example A and Examples 1-3 differ from each other only in how the final rinse/dry step is performed in each example. In general, during the final rinse/dry step, the wafers, the plumbing, and the chamber are rinsed and purged with various combinations of hot DI water, cold DI water and nitrogen. By the end of the final rinse/dry step, the DI water is completely removed from the wafers, plumbing, and chamber so that they are completely dry. This is done by appropriately turning off the DI rinse functions and switching to nitrogen functions in the high speed dry mode of the ZETA® spray processor. Transitioning between rinsing and drying during the final rinse/dry step for Comparative Example A and Examples 1-3 is specifically described below. In general, nitrogen gas is dispensed through the turntable/posts (i.e., "chamber drying" orfices) and center spray post (center atomizing orifices and left side orifices (i.e., "wafer-drying" orifices) during the final drying phase of the ZETA® spray processor. During the final drying phase, the wafers, the plumbing, and the process chamber are dried as the wafers are spun at about 300 rpm for 5 minutes. The final wafer temperature is measured using the RTDs mounted on the sidewall of the ZETA® spray processor.

After the final drying is completed, the wafers are removed from the process chamber and then moved back into the FOUP. Next, the test wafers in slots 1, 13, and 25 are again analyzed by measuring the defects on the wafers using a non-patterned wafer inspection tool. This metrology system scans a wafer and reports the location and size of all defects on a wafer surface. This report is termed the "post-count" of defects after processing for each of the test wafers.

The data collected for each wafer (i.e., pre-count and post-count) is presented as a "true adders" value and a "delta" value. The "true adders" value is obtained by counting the number of defects reported in the "post-count" that are at new locations on the wafer surface that were not observed in the "pre-count" report. For example, suppose 2 defects were reported in a "pre-count" at positions on a wafer surface having X-Y coordinates 1,1 and 2,2 respectively. If 3 defects were reported in a "post-count" at positions on the wafer surface having X-Y coordinates 1,1, 3,3, and 4,4, there would be 2 defects reported in the "post-count" having new locations not reported in the "pre-count." Thus, the "true adders" value for this data would be 2.

The "delta" value is obtained subtracting the "pre-count" value from the "post-count" value reported for each test wafer. For example, if a test wafer had a "pre-count" value 100 and a "post-count" value of 90, the "delta" value for that wafer would be −10.

COMPARISON EXAMPLE A

For Comparison Example A, forty-eight process runs were performed using three test wafers per run (i.e., a total of 144 test wafers). During each process run and after the wafers are subjected to an SC1 chemical step as described above, the wafers are subjected to a conventional final rinse/dry step. The conventional rinse/dry step includes dispensing cold DI water (about 20 C) through the center spray post and side bowl spray post and onto the wafers. The DI water flow rate through the center spray post is between about 6 and 10 l pm (typically about 8 l pm), and the flow rate through the side bowl post is about 10 l pm. The wafers are rotated on the turntable at about 60 rpm. The DI water dispensed through the center spray post is atomized with 3 cfm of nitrogen gas at ambient temperature and a pressure of about 30-35 psi. Nitrogen gas was also dispensed through the "chamber dry" orifices. This rinsing (i.e., dispensing of DI water) continues for 30 seconds.

After the dispensing of DI water terminated, the rotation of the turntable was slowed to 10 rpm. The DI water supply lines leading to the "wafer-drying" orifices (i.e., the left side orifices) of the center spray post and side bowl spray post were purged into the chamber using nitrogen gas for 90 seconds. Nitrogen gas is also dispensed through the "chamber dry" orifices. After purging for 90 seconds, the turntable speed is increased to 300 rpm for 5 minutes. During this 5 minute period, the wafers and chamber become dry. The wafer temperature at the end of the final drying phase was approximately 5 C above ambient, or 23 C.

Figure 2A:
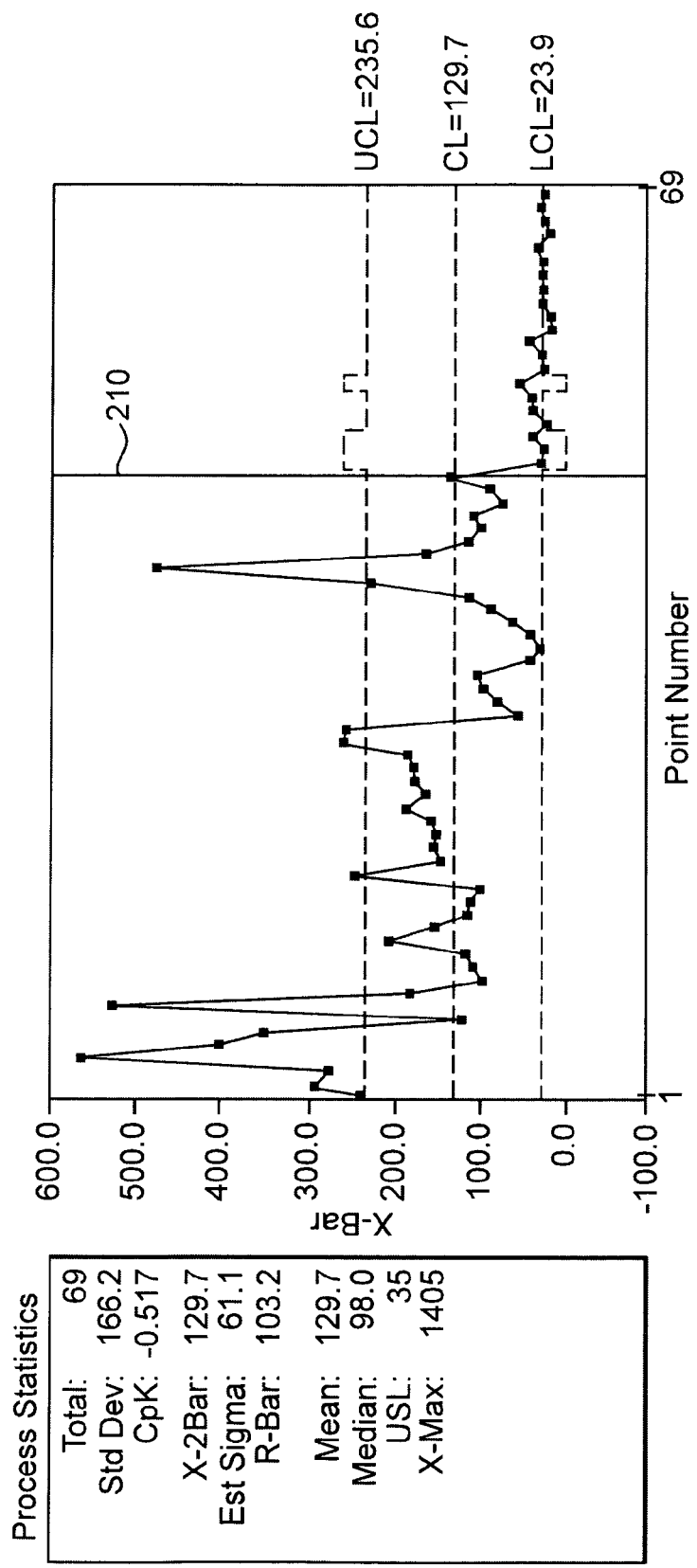
FIG. 2a shows a graph representing the "true adders" having a size greater than 65 nanometers for Comparison Example A and Examples 1-3.

The pre-count and post-count data for Comparison Example A is illustrated in FIGS. 2*a*, 2*b*, 3*a*, and 3*b*. The data to the left of line 210 in FIG. 2*a* shows the "true adders" having a size greater than 65 nanometers for the 48 test runs (each run is the average "true adders" for the three test wafers in slots 1, 13, and 25).

Figure 2B:
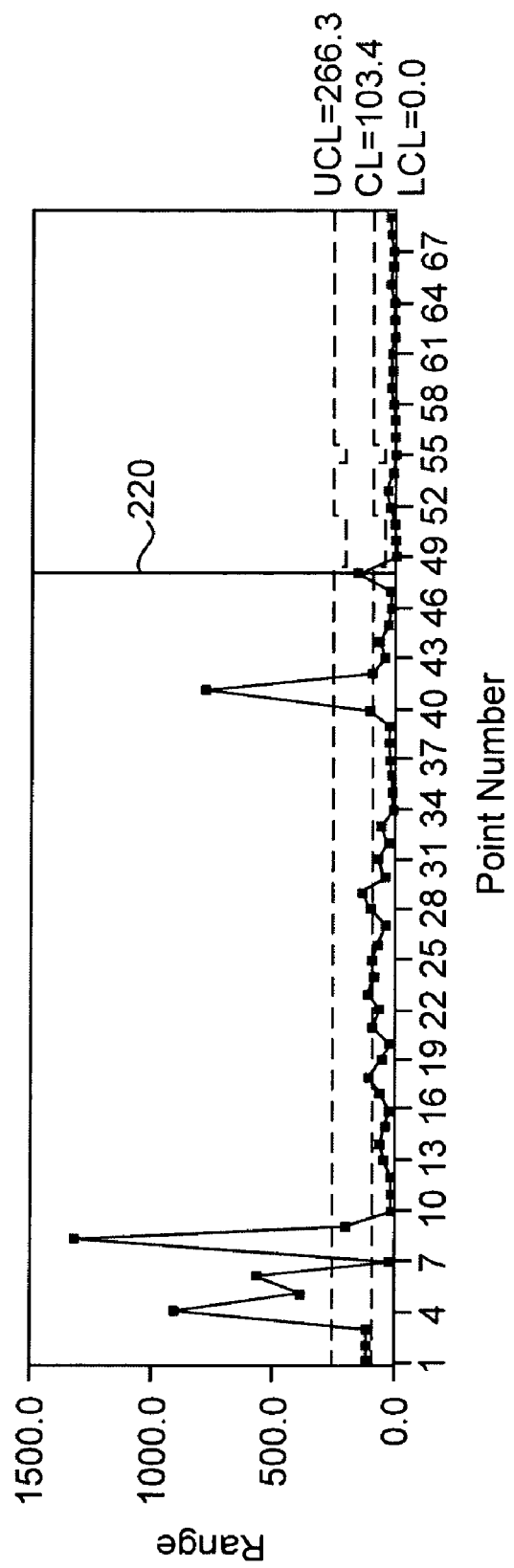
FIG. 2b shows a graph representing the range of "true adders" having a size greater than 65 nanometers for all three test wafers per run for Comparison Example A and Examples 1-3.

The data to the left of line 220 in FIG. 2*b* shows the range of "true adders" values for all three test wafers per run. For example, if the wafers added −20, 25 and 100 particles the range would be 120.

Figure 3A:
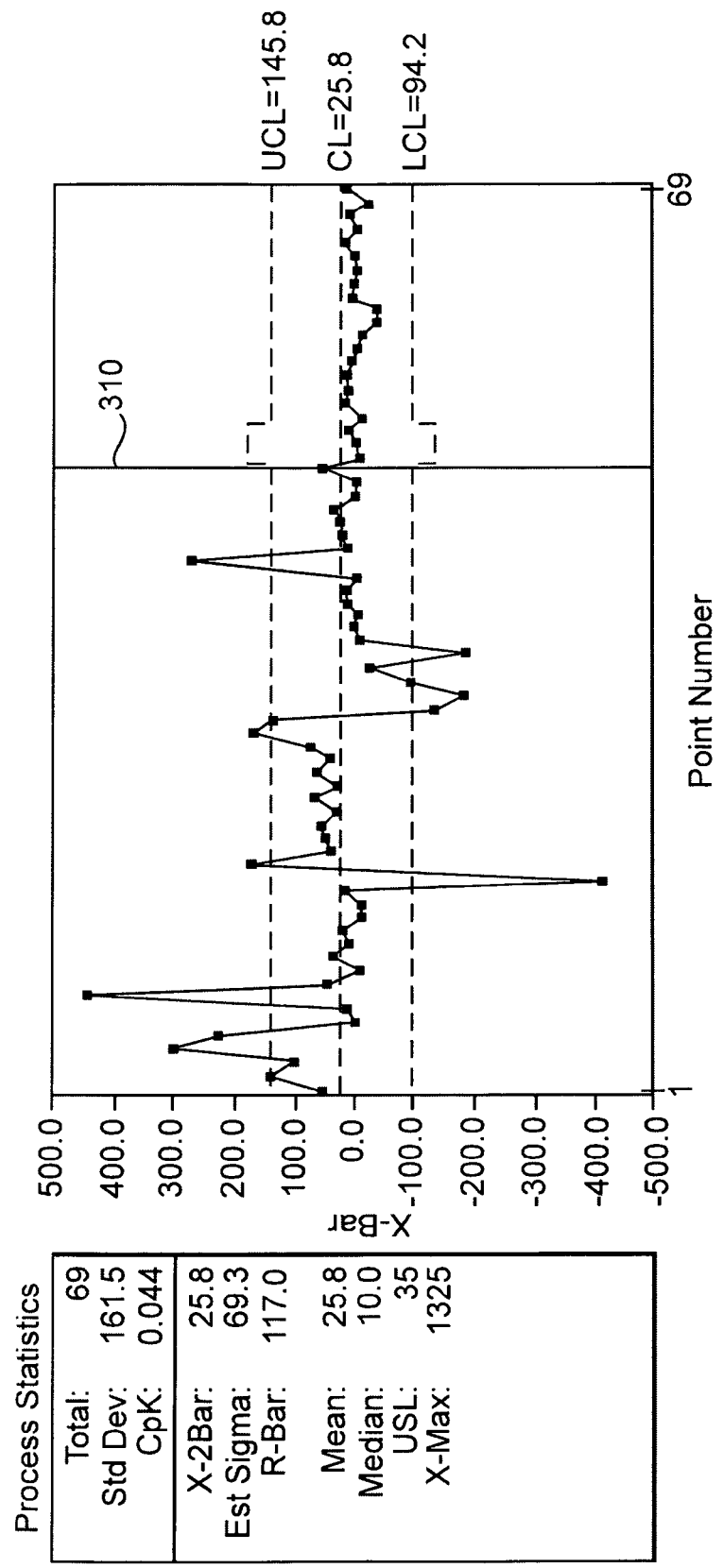
FIG. 3a shows a graph representing the "delta" for defects having a size greater than 65 nanometers for each run for Comparison Example A and Examples 1-3.
Figure 3B:
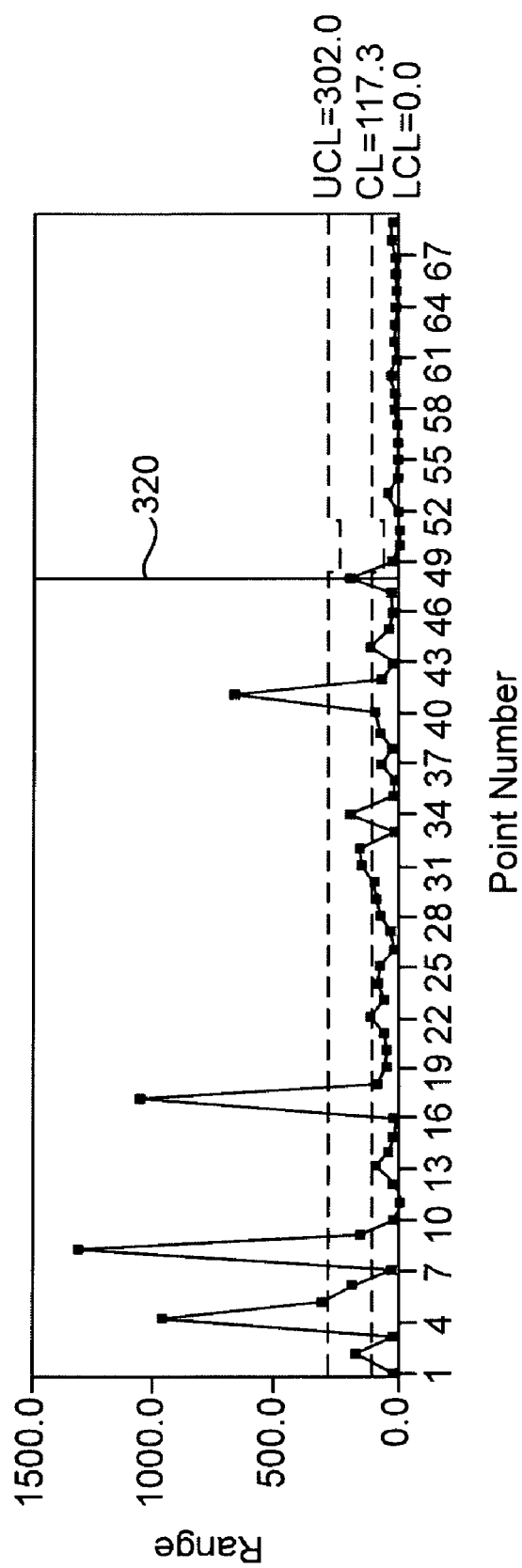
FIG. 3b shows a graph representing the range of "delta" values for all three test wafers per run for Comparison Example A and Examples 1-3.

The data to the left of line 310 in FIG. 3*a* shows the "delta" for defects having a size greater than 65 nanometers for each run. The data to the left of line 320 in FIG. 3*b* shows the range of "delta" values for all three test wafers per run.

This data for the conventional final rinse/dry shows a significant range of particles added.

EXAMPLE 1

For each process run and after the wafers are subjected to an SC1 chemical step as described above, the wafers are subjected to a final rinse/dry step according to the present invention. The rinsing (i.e., dispensing of DI water) for 30 seconds in the final rinse/dry step of Comparative Example A is performed in Example 1, except that the rinse water temperature is lower. The transition between final rinse and final dry is different than in Comparison Example A. At the end of the 30 seconds, the rotation of the turntable continues at 60 rpm and DI water continues to be dispensed from side bowl spray post as the DI water supply line leading to the "wafer-drying" orifices (i.e., the left side orifices) of the center spray post is purged into the chamber using nitrogen gas for 85 seconds. Nitrogen gas is also dispensed through the "chamber dry" orifices. After purging for 85 seconds, the rotation of the turntable is slowed to 10 rpm and the DI water supply line leading to the side bowl spray post is aspirated to remove the residual DI water in the supply line (i.e., the DI water supply line leading to the side bowl spray post is not purged into the process chamber). After aspirating the side bowl spray post, the turntable speed is increased to 300 rpm for 15 minutes. During this 15-minute period, the wafers and chamber become dry. The wafer temperature at the end of the final drying phase was approximately the same as the cold DI supplied to the system, which can vary between 17 and 21 C.

EXAMPLE 2

For each process run and after the wafers are subjected to an SC1 chemical step as described above, the wafers are subjected to a final rinse/dry step according to the present invention. The rinsing (i.e., dispensing of DI water) for 30 seconds in the final rinse/dry step of Comparative Example A is performed in Example 2. The transition between final rinse and final dry is different than in Comparison Example A. At the end of the 30 seconds, the rotation of the turntable continues at 60 rpm and DI water continues to be dispensed from side bowl spray post as the DI water supply line leading to the "wafer-drying" orifices (i.e., the left side orifices) of the center spray post is purged into the chamber using nitrogen gas for 85 seconds. Nitrogen gas is also dispensed through the "chamber dry" orifices. After purging for 85 seconds, the rotation of the turntable is slowed to 10 rpm and the DI water supply line leading to the side bowl spray post is aspirated to remove the residual DI water in the supply line (i.e., the DI water supply line leading to the side bowl spray post is not purged into the process chamber). After aspirating the side bowl spray post, the turntable speed is increased to 300 rpm for 5 minutes. During this 5-minute period, the wafers and chamber become dry. The wafer temperature at the end of the final drying phase was approximately 5 C above ambient, or 23 C.

EXAMPLE 3

For each process run and after the wafers are subjected to an SC1 chemical step as described above, the wafers are subjected to a final rinse/dry step according to the present invention. The rinsing (i.e., dispensing of DI water) for 30 seconds in the final rinse/dry step of Comparative Example A is performed in Example 3, except that the rinse water temperature is higher. The transition between final rinse and final dry is different than in Comparison Example A. At the end of the 30 seconds, the rotation of the turntable continues at 60 rpm and DI water continues to be dispensed from side bowl spray post as the DI water supply line leading to the "wafer-drying" orifices (i.e., the left side orifices) of the center spray post is purged into the chamber using nitrogen gas for 85 seconds. Nitrogen gas is also dispensed through the "chamber dry" orifices. After purging for 85 seconds, the rotation of the turntable is slowed to 10 rpm and the DI water supply line leading to the side bowl spray post is aspirated to remove the residual DI water in the supply line (i.e., the DI water supply line leading to the side bowl spray post is not purged into the process chamber). After aspirating the side bowl spray post, the turntable speed is increased to 300 rpm for 1 minute. During this 1-minute period, the wafers and chamber become dry. The wafer temperature at the end of the final drying phase was significantly above ambient temperature by using rinse water having a temperature up to about 95 C.

The pre-count and post-count data for Examples 1-3 is illustrated in FIGS. 2a, 2b, 3a, and 3b. The data to the right of line 210 in FIG. 2a shows the "true adders" having a size greater than 65 nanometers for the runs in Examples 1-3 (each run is the average "true adders" for the three test wafers in slots 1, 13, and 25).

The data to the right of line 220 in FIG. 2b shows the range of "true adders" values for all three test wafers per run in Examples 1-3.

The data to the right of line 310 in FIG. 3a shows the "delta" for defects having a size greater than 65 nanometers for each run in Examples 1-3. The data to the right of line 320 in FIG. 3b shows the range of "delta" values for all three test wafers per run in Examples 1-3.

This data of Examples 1-3 demonstrates the improved performance with respect to added particles and flexibility of rinse water temperature when using final rinse/dry hardware and procedures according to the present invention.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of processing one or more microelectronic substrates, the method comprising the steps of:

positioning one or more microelectronic substrates in a process chamber;

dispensing a first liquid flow into the process chamber and onto the one or more substrates via a first fluid delivery pathway;

dispensing a second liquid flow into the process chamber and onto the one or more substrates via a second fluid delivery pathway, wherein the first fluid delivery pathway and the second fluid delivery pathway are not the same fluid delivery pathway;

stopping dispensing of the first liquid flow, wherein an amount of residual liquid remains in the first fluid delivery pathway;

while the dispensing of the second liquid flow is occurring, purging the first fluid delivery pathway into the process chamber;

after stopping purging of the first fluid delivery pathway, stopping the dispensing of the second liquid flow, wherein a residual amount of liquid remains in the second fluid delivery pathway; and removing at least a portion of the residual amount of liquid in the second fluid delivery pathway through a fluid removal pathway such that said portion of the residual amount of liquid in the second fluid delivery pathway is not purged onto the one or more microelectronic substrates.

2. The method of claim 1, wherein the liquid flowing through the first and second fluid delivery pathways comprises an aqueous rinse liquid at a temperature in the range of from 60° C. to 100° C.

3. The method of claim 1, wherein the one or more substrates are positioned on a turntable and further comprising the step of causing the turntable to rotate during the dispensing steps.

4. The method of claim 1, wherein the one or more substrates are positioned on a turntable and further comprising the step of causing the turntable to rotate while the first fluid delivery pathway is purged into the process chamber.

5. The method of claim 1, further comprising, after the removing step, the step of drying the one or more substrates via spin drying and discharging a drying gas into the process chamber via the first and second fluid delivery pathways.

6. The method of claim 5, further comprising the step of, after the drying step, removing the one or more substrates from the process chamber.

7. The method of claim 1, further comprising the step of dispensing a third liquid flow into the process chamber and onto the one or more substrates via a third fluid delivery pathway, wherein the third liquid flow is stopped when the first liquid flow is stopped and an amount of residual liquid remains in the third fluid delivery pathway, wherein the third fluid delivery pathway is purged into the process chamber while the dispensing of the second liquid flow is occurring, and wherein the dispensing of the second liquid flow is stopped after stopping purging of the third fluid delivery pathway.

8. The method of claim 1, wherein the removing step comprises sucking back said portion of the residual amount of liquid.

9. A method for processing one or more microelectronic substrates, comprising the steps of:

positioning the one or more microelectronic substrates in a process chamber;

rinsing the one or more microelectronic substrates with a first liquid flow that is sprayed through a first fluid delivery pathway;

after said rinsing, causing a second liquid flow to be dispensed from a second fluid delivery pathway to wet the one or more substrates;

wherein the first fluid delivery pathway and the second fluid delivery pathway are not the same fluid delivery pathway;

stopping the spraying of the first liquid flow, wherein an amount of residual liquid remains in the first fluid delivery pathway;

while the dispensing of a second liquid flow is occurring, purging the residual liquid in the first fluid delivery pathway into the process chamber;

after said purging, stopping the dispensing of the second liquid flow and causing a residual amount of a liquid in the second fluid delivery pathway to be aspirated from the second fluid delivery pathway; and after said aspirating, drying the one or more substrates.

10. The method of claim 9, wherein the one or more substrates are positioned on a turntable and further comprising the step of causing the turntable to rotate while the residual amount of a liquid in the first fluid delivery pathway is purged into the chamber.

11. The method of claim 9, wherein the liquid flowing through the first and second fluid delivery pathways during rinsing and purging comprises an aqueous rinse liquid at a temperature in the range of from 60° C. to 100° C.

* * * * *

UNITED STATES PATENT AND TRADEMARK OFFICE
CERTIFICATE OF CORRECTION

PATENT NO. : 7,556,697 B2
APPLICATION NO. : 10/866916
DATED : July 7, 2009
INVENTOR(S) : Benson et al.

It is certified that error appears in the above-identified patent and that said Letters Patent is hereby corrected as shown below:

Column 10
Line 37, "1 pm" should be --lpm--.
Line 39, "1 pm" should be --lpm--.

Column 12
Line 44, "1 pm" should be --lpm--.

Column 13
Line 55, "1 pm" should be --lpm--.
Line 56, "1 pm" should be --lpm--.
Line 57, "1 pm" should be --lpm--.

Signed and Sealed this

Third Day of November, 2009

David J. Kappos
*Director of the United States Patent and Trademark Office*